(12) United States Patent
Sakhrani et al.

(10) Patent No.: US 6,582,823 B1
(45) Date of Patent: Jun. 24, 2003

(54) WEAR-RESISTANT POLYMERIC ARTICLES AND METHODS OF MAKING THE SAME

(75) Inventors: Vinay Sakhrani, Raleigh, NC (US); Jerome J. Cuomo, Cary, NC (US); Paul M. Vernon, Jr., Chapel Hill, NC (US); Charles K. Chiklis, Cary, NC (US); Charles Tomasino, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/304,422

(22) Filed: Apr. 30, 1999

(51) Int. Cl.⁷ .................. B32B 27/36; B32B 17/06; B32B 9/04; B32B 13/12

(52) U.S. Cl. ............... 428/412; 428/420; 428/428; 428/429; 428/447; 428/448; 428/451

(58) Field of Search ............... 428/447, 448, 428/428, 429, 451, 420, 412

(56) References Cited

U.S. PATENT DOCUMENTS

| | | | |
|---|---|---|---|
| 3,713,869 A | 1/1973 | Geffcken et al. | 117/70 A |
| 3,856,534 A * | 12/1974 | Fletcher et al. | 106/13 |
| 4,029,842 A | 6/1977 | Yoshida et al. | 428/334 |
| 4,081,421 A | 3/1978 | Yoshida et al. | 260/32.8 |
| 4,190,681 A | 2/1980 | Hall et al. | 427/45.1 |
| 4,239,798 A * | 12/1980 | Schroeter et al. | 428/331 |
| 4,284,685 A * | 8/1981 | Olson et al. | 428/331 |
| 4,301,212 A | 11/1981 | Cohnen et al. | 428/412 |
| 4,328,646 A | 5/1982 | Kaganowicz | 51/281 R |
| 4,341,841 A | 7/1982 | Ohno et al. | 428/414 |
| 4,401,500 A | 8/1983 | Hamada et al. | 156/307.5 |
| 4,544,582 A | 10/1985 | Benjamin | 427/407.1 |
| 4,599,272 A | 7/1986 | Ichikawa | 428/412 |
| 4,632,527 A | 12/1986 | Masso et al. | 351/166 |
| 4,652,497 A * | 3/1987 | Ascarelli et al. | 428/447 |
| 4,743,327 A | 5/1988 | DeHaan et al. | 156/272.6 |
| 4,842,941 A | 6/1989 | Devins et al. | 428/412 |
| 4,927,704 A | 5/1990 | Reed et al. | 428/221 |
| 5,009,920 A | 4/1991 | Lee | 427/9 |
| 5,030,478 A | 7/1991 | Lin et al. | 427/54.1 |
| 5,043,390 A | 8/1991 | Koishi et al. | 525/200 |
| 5,124,058 A | 6/1992 | Corti et al. | 252/54 |
| 5,190,807 A | 3/1993 | Kimock et al. | 428/216 |

(List continued on next page.)

OTHER PUBLICATIONS

Saperstein et al,; *Improved Surface Adhesion and Coverage of Perfluoropolyether Lubricants Following Far–UV Irradiation*, Langmuir, 6(9):1522–1524 (1990).

Bharat Bhushan; *Magnetic Recording Surfaces*, Chapter 7:116–133 (1992) (approximate).

International Search Report dated Aug. 14, 2000; International Application No. PCT/US00/10409.

*Primary Examiner*—Paul Thibodeau
*Assistant Examiner*—Kevin R. Kruer
(74) *Attorney, Agent, or Firm*—Myers Bigel Sibley & Sajovec

(57) ABSTRACT

A substantially optically transparent article such as a lens having a wear-resistant surface comprises a substantially optically transparent polymeric substrate (e.g., a polycarbonate or polymethyl methacrylate substrate), and having a surface portion. A hard antiabrasive interconnecting layer is formed on the surface portion (typically by vacuum deposition and preferably by plasma-enhanced chemical vapor deposition), and a lubricious hydrophobic coating layer is bonded to the interconnecting layer. The lubricious hydrophobic coating layer, together with the hard antiabrasive interconnecting layer, form a wear-resistant surface on the substrate. The lubricious coating layer is formed from a hydrophobic organic lubricant such as a perfluoropolyether, a fatty acid, or a fatty acid esters. Methods of making such articles are also disclosed.

13 Claims, 1 Drawing Sheet

U.S. PATENT DOCUMENTS

| | | | |
|---|---|---|---|
| 5,206,308 A | 4/1993 | Auerbach et al. | 525/410 |
| 5,268,217 A | 12/1993 | Kimock et al. | 428/216 |
| 5,298,587 A * | 3/1994 | Hu et al. | 528/10 |
| 5,331,487 A | 7/1994 | Gregory et al. | 360/97.02 |
| 5,382,614 A | 1/1995 | Scarati et al. | 524/108 |
| 5,413,865 A | 5/1995 | Nakamura et al. | 428/432 |
| 5,415,927 A | 5/1995 | Hirayama et al. | 428/307.3 |
| 5,445,871 A | 8/1995 | Murase et al. | 428/215 |
| 5,446,209 A | 8/1995 | Lagow | 568/677 |
| 5,453,539 A | 9/1995 | Kondo et al. | 562/586 |
| 5,476,717 A | 12/1995 | Floch | 428/421 |
| 5,494,742 A | 2/1996 | Seki et al. | 428/332 |
| 5,508,368 A | 4/1996 | Knapp et al. | 427/534 |
| 5,512,374 A | 4/1996 | Wallace et al. | 428/422 |
| 5,550,331 A * | 8/1996 | Thompson | 181/102 |
| 5,594,231 A * | 1/1997 | Pellicori et al. | 235/462 |
| 5,622,784 A * | 4/1997 | Okaue et al. | 428/447 |
| 5,635,245 A * | 6/1997 | Kimock et al. | 427/249 |
| 5,643,423 A | 7/1997 | Kimock et al. | 204/192.35 |
| 5,698,266 A | 12/1997 | Floch et al. | 427/376.2 |
| 5,707,742 A | 1/1998 | Usuki et al. | 428/422 |
| 5,718,967 A | 2/1998 | Hu et al. | 428/216 |
| 5,744,227 A | 4/1998 | Bright et al. | 428/216 |
| 5,789,071 A | 8/1998 | Sproul et al. | 428/216 |
| 5,846,650 A | 12/1998 | Ko et al. | 428/36.91 |
| 5,858,536 A | 1/1999 | Yanagisawa | 428/408 |
| 5,873,931 A * | 2/1999 | Scholz et al. | 106/12 |
| 5,914,151 A * | 6/1999 | Usuki | 427/128 |
| 6,001,485 A * | 12/1999 | Kobayashi et al. | 428/428 |
| 6,040,053 A * | 3/2000 | Scholz et al. | 428/412 |
| 6,111,696 A * | 8/2000 | Allen et al. | 359/495 |
| 6,156,389 A * | 12/2000 | Brown et al. | 427/393.4 |
| 6,160,067 A * | 12/2000 | Eriyama et al. | 427/214 |

* cited by examiner

WEAR-RESISTANT POLYMERIC ARTICLES AND METHODS OF MAKING THE SAME

FIELD OF THE INVENTION

This invention relates to substantially optically transparent articles such as lenses having a wear-resistant surface formed thereon. Methods of making the same are also disclosed.

BACKGROUND OF THE INVENTION

There are numerous methods for coating substrates to improve their performance, e.g., lifetime abrasion wear resistance. For example, many commercial plastic ophthalmic and sunglass lenses are coated with either organic acrylate polymer coatings or polysiloxane polymer coatings. Although these polymer coatings offer a significant improvement in abrasion resistance relative to the uncoated plastic lens, the perceived abrasion of the coated plastic lenses compared to glass is still poor. Inorganic hardcoatings deposited directly on the article have also been employed as protective layers to improve the abrasion resistance. However, these coatings have performance problems. Hardcoatings subjected to thermal and mechanical stresses may crack as a stress release mechanism when the article is subjected to various heating/cooling cycles. Wet adhesion of these films is poor, exposure to hot and cold moisture cause these films to delaminate from the substrate.

U.S. Pat. No. 5,476,717 to Floch describes an antireflective material comprising an organic or inorganic substrate, an adhesion promoter layer, an antireflection coating formed from colloids of silica in a siloxane binder; a silazane coupling layer, and an outer antiabrasion layer formed by the solvent deposition of a fluorinated polymer (particularly the polytetrafluoroethylene derivative known as TEFLON AF®. The antiabrasion layer relies solely on the antifriction properties of the PTFE polymer, and is not itself resistant to gouging or scratching by forcefully applied abrasive particles which penetrate into the antiabrasion layer.

SUMMARY OF THE INVENTION

In accordance with the foregoing, a first aspect of the present invention is a substantially optically transparent article having a wear-resistant surface. The article comprises: a substantially optically transparent polymeric substrate having a surface portion, and having a hard antiabrasive interconnecting layer formed on the surface portion. A lubricious hydrophobic coating layer is bonded to the interconnecting layer, with the hard antiabrasive interconnecting layer and the lubricious hydrophobic coating layer together forming the wear-resistant surface. The lubricious hydrophobic coating layer preferably is formed of a hydrophobic organic lubricant selected from the group consisting of fluorocarbons, fatty acids, and fatty acid esters.

In a preferred embodiment of the foregoing:
(a) the substrate comprises a material selected from the group consisting of polycarbonate, poly (2,2'-dihydroxyphenylpropane)carbonate, polydiethyleneglycol bis(allyl carbonate), polyacrylate, and polystyrene;
(b) The hard anti-abrasive interconnecting layer is vacuum deposited and comprises a material of the general formula M—O—C—H—N (wherein M is preferably selected from the group consisting of silicon, titanium, tantalum, germanium, boron, zirconium, aluminum, hafnium and yttrium);
(c) the hard antiabrasive interconnecting layer is at least a monolayer thick (e.g., up to 10 microns thick);
(d) the lubricious hydrophobic coating layer is from about 1 to about 500 Angstroms thick;
(e) the organic lubricant comprises a perfluoropolyether; and
(f) the wear-resistant surface has a Bayer Index of at least about 5.

A method of making a substantially optically transparent articles as described above comprises the steps of:
(a) providing a substantially optically transparent polymeric substrate having a surface portion;
(b) depositing a hard antiabrasive interconnecting layer on the surface portion, preferably by vacuum deposition; and then
(c) bonding a lubricious hydrophobic coating layer to the interconnecting layer so that the hard antiabrasive interconnecting layer and the lubricious hydrophobic coating layer together forming the wear-resistant surface. The lubricious hydrophobic coating layer preferably comprises a hydrophobic organic lubricant selected from the group consisting of fluorocarbons, fatty acids, and fatty acid esters.

DETAILED DESCRIPTION OF THE PREFERRED EMBODIMENTS

"Substantially optically transparent" as used herein means that at least some wavelengths of visible, infrared or and ultraviolet light passes through the article, whether or not the article is substantially visually transparent (that is, transparent to the human eye). Substantially visually transparent articles (i.e., articles that may be seen through by the unaided human eye) may be clear or tinted (e.g., sunglass lenses would be tinted, though substantially visually transparent.).

For the purposes of the present invention, the Bayer Index as established by the Council of Anti-Reflection Coatings is essentially the same as ASTM 735-94, except that zirconium oxide is used as the abrasive rather than sand or alumina.

"Contact angle" as used herein is a test of hydrophobicity of the coating of a surface in which a water droplet is placed on the surface and the degree of spreading is measured as the contact angle between the surface and the side of the droplet. Contact angles greater than 45 degrees represent less spreading, and indicate a hydrophobic surface. Hydrophilic surfaces have contact angles that approach zero.

"Bonded" as used herein with respect to the hydrophobic layer means that the hydrophobic layer remains bound to the interconnecting layer, as determined by a contact angle test, even after washing that surface with isopropanol.

"Inert gas" as used herein include, but is not limited to, argon, xenon, neon, helium, and krypton.

A "monolayer" as used herein is a layer one molecule thick. A monolayer may occupy all of the available surface area or a portion of the available surface area of the substrate on which it is formed (e.g., at least one quarter of the available surface area).

Figure 1:
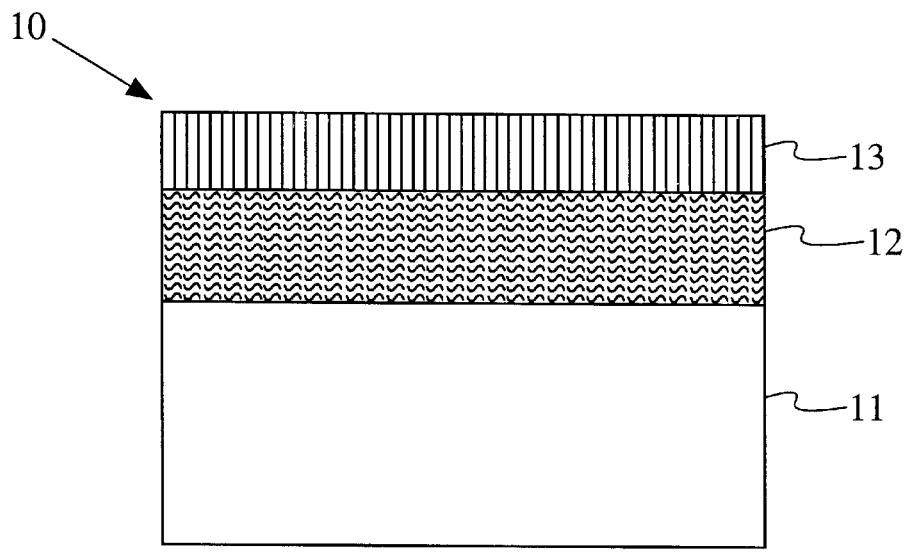
FIG. 1 is a schematic, side-sectional view of an article of the present invention.
Figure 2:
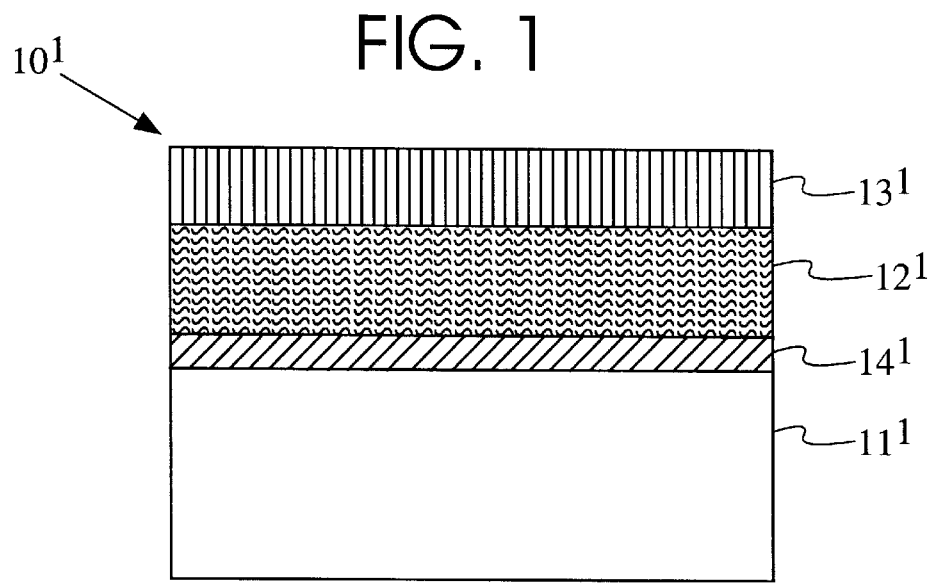
FIG. 2 is a schematic, side sectional view of an article that is a second embodiment of the present invention.

First and second embodiments 10, 10' of the invention are shown in FIGS. 1–2. As generally explained above, the articles comprise a substrate 11, 11', a hard antiabrasive interconnecting layer 12, 12', and a lubricious hydrophobic coating layer 13, 13'. As shown in FIG. 2, one or more additional intervening layer(s) 14', such as an intervening "C-coat", may be formed between the substrate and the interconnecting layer. The lubricious hydrophobic coating layer is, however, preferably bonded directly to the interconnecting layer.

The thickness of the substrate 11, 11' is not critical, but is typically about 0.01 millimeters or more (e.g., to about 1, 5 or 10 centimeters or more). The shape is not critical, and the substrate may be flat, curved, patterned, etc., along any portion thereof, including the portion on which the intervening layer or interconnecting layer is deposited. The substrate may be formed of a single material or a plurality of materials and have multiple layers, as in a laminated substrate or a C-coated substrate, where the C-coat thus forms an intervening layer. The thickness of any intervening layers 14' is not critical, but is typically about 0.01 microns or more (e.g., to about 10, 100 or 1000 microns) when such layer (or combination of layers) is present. The thickness of the interconnecting layer will vary depending upon the end use contemplated for the particular article, but is typically at least a monolayer (e.g., to about 10, 100 or 1000 microns). Finally, the thickness of the lubricious hydrophobic coating layer will vary depending upon the end use contemplated for the article, but will typically be at least a monolayer (e.g., 1 to about 500 Angstroms).

Substrates used in the present invention may be formed of any polymeric or plastic material. Illustrative materials include polyacrylate, polyester, polyethylene, polypropylene, polyamides, polylmides, polycarbonate, epoxy, phenolic, acrylonitrile-butadiene-styrene and acetal materials. Preferred substrate materials include polycarbonate, poly (2,2'-dihydroxyphenylpropane) carbonate, polydiethyleneglycol bis(allyl carbonate) (e.g., CR-39™), polyacrylate and polystyrene. When visual transparency is desired the preferred substrate is preferably formed of polycarbonate or polyacrylate resin such as polymethyl methacrylate) because of their excellent physical, mechanical and chemical properties. The substrates may contain various additives such as UV absorbers, fillers, colorants, antioxidants, plasticizers and the like, in accordance with known techniques.

In general, the choice of substrate material is ultimately determined by the end use contemplated for the article. Numerous different articles can be formed by the present invention, including but not limited to lenses such as ophthalmic lenses, automobile headlamps, stoplight lenses, etc.; windows including windshields and windscreens; instrument and computer display screens and other display screens such as for flat panel monitors; visors, safety shields and the like; watch crystals; etc.

Articles of the invention can be incorporated into a variety of products. Video monitors can be provided having a display screen that is an article of the present invention; eyeglasses (prescription and non-prescription; tinted or non-tinted) can be provided with a pair of lenses of the present invention; watches may be provided with watch crystals of the present invention. Aircraft and vehicles can be provided with windows, lamp lenses and windshields of the present invention. Either or both surfaces of the articles can incorporate the wear-resistant surface.

As noted above with respect to FIG. 2, one or more additional coating layers 14' may be applied to the surface of the substrate prior to the application of the interconnecting layer. In some cases the substrates are commercially available with such coatings pre-formed thereon. Coating 14' may be applied by conventional methods such as dip coating, spraying, brushing, roll coating and other art-recognized techniques. This layer increases the hardness of the plastic article by hardening the surface and is commonly used as the scratch resistant coating for ophthalmic lenses. The coating generally exhibits some compositional differences from the interconnecting layer of this invention and is referred to as the "C" coating for ophthalmic lenses. For example, dispersions of colloidal silica in organosilicon, or organic polymers such as polyacrylates, are known in the art as C coating materials and are described, for example, in U.S. Pat. Nos. 3,986.997, 4,027,073, 4,239,798, 4,284,685, and 4,436,851 (applicants specifically intend that all U.S. patent references cited herein be incorporated herein by reference).

The composition of the interconnecting layer 12, 12' depends on the end use contemplated for the article. Organosilicons are particularly useful for forming the interconnecting material. Organosilicon as used herein is meant to embrace organic compounds in which at least one silicon atom is bonded to one carbon atom and includes silicone materials, as well as materials commonly referred to as silanes, siloxanes, silanols, silazanes and organosilicones. Preferred organosilicon compounds of the present invention are tetramethyl silane, hexamethydisilane, hexamethyl disiloxane, octamethylcyclotetrasiloxane, and hexamethyl-disilizane. When abrasion-resistant materials other than those containing silicon are to be employed, other classes of interconnecting materials, such as diamond-like carbon or various organometallic compounds can be used. For example, methane, other hydrocarbons or metal-containing hydrocarbons may be the precursor for depositing a diamond-like interconnecting layer. Titanium isopropoxide can be the precursor when titanium oxides are to be the interconnecting layer.

The interconnecting layer of this invention can be deposited by a number of processes, particularly vacuum and/or plasma deposition processes such as physical vapor deposition, sputtering, vacuum evaporation, and plasma enhanced chemical vapor deposition (plasma deposition processes are to be considered as vacuum deposition processes herein). The process may utilize, for example, hydrocarbon, metal or metalloid hydrocarbon feed compounds (typically feed gases) introduced with or without argon or other inert gas; energized into a plasma by direct current, radio frequency, microwave, enhanced plasmas or by hollow cathode magnetron energy sources. The energized precursor (with or without energized argon or other inert gas) is promoted into an excited state, producing ionic fragments and molecules in an excited state, which bombard and reconstruct on surfaces to produce a hard amorphous coating. Numerous different types of materials, ranging from organic to inorganic, can be formed as a layer by these processes. Depending upon the process conditions, the films that are produced can be diamond-like, and comprise a member of the class of materials known as Diamond-Like Carbon (DLC). DLC is the generic name for a family of materials in which the molecular backbone is primarily carbon, with some hydrogen attached. The precursor and the process conditions determine the specific compositions and properties. For example, hydrocarbons such as $CH_4$, $C_2H_6$ and the like produce films of hydrogenated amorphous carbon known as DLC. Organometallic precursors containing Si, Al, Ti and the like such as Si(CH$_3$)$_4$, or Ti(OCH$_3$)$_4$ will produce metal-containing DLCs which are referred to as silicon or titanium containing DLCs such as Si-DLC. The family of DLCs can be made with fluorine containing precursors such as CF$_4$, and surfaces so treated will have deposited thereon amorphous fluorinated carbon DLC. These films are known in the art and have hardness and tribological properties that are very attractive and desirable. U.S. Pat. Nos. 4,328,646, 4,190,681, 3,713,869, 5,508,368, 5,190,807, 4,927,704, 5,206,308, and 4,842,941 describe suitable processes for producing these types of coatings, and are to be incorporated herein by reference in their entirety.

The interconnecting layer is preferably capable of forming strong bonds with both the polymeric substrate and the lubricious hydrophobic coating layer, as described in U.S. Pat. No. 5,190,807 to Kimock et al., the disclosure of which is incorporated by reference herein in its entirety. The strong bond may be directly formed or indirectly formed through an intervening layer.

The interconnecting layer itself is preferably substantially optically transparent, such as transparent to light in the visible region of 350 to approximately 750 nanometers, as described in U.S. Pat. No. 5,268,217 to Kimock et al., the disclosure of which is incorporated by reference herein in its entirety. As also described therein, the interconnecting layer may be (or may not be) a material devoid of alkali metal atoms and fluorine, and may be a material selected from the group consisting of silicon nitride, titanium nitride, tantalum nitride, hafnium nitride, zirconium nitride, boron nitride, yttrium oxide, yttrium nitride, germanium oxide, hafnium oxide, silicon oxide, silicon dioxide, tantalum oxide, titanium oxide, zirconium oxide, silicon carbide, germanium carbide, titanium carbide, mixtures thereof, and chemically bonded combinations thereof.

Additional non-limiting examples of compounds suitable for the interconnecting layer include silicon oxynitride, silicon carbonitride, boron oxide, boron nitride, aluminum oxide, aluminum nitride, titanium dioxide, tantalum oxide, germanium oxide, germanium nitride and germanium carbide (including mixtures and chemically bonded combinations thereof, including those in the preceding paragraph).

The interconnecting layer can be produced by the process described in U.S. Pat. No. 5,009,920 to Lee (the disclosure of which is to be incorporated herein in its entirety), which describes a process for plasma enhanced chemical vapor deposition of a film on a substrate, in which the feed substances comprise at least one inert carrier gas and at least one reactive agent, such as O$_2$, N$_2$O, and H$_2$. Typically the feed substance comprises a starting reactant in the form of M—R wherein M denotes a metal atom and R denotes an organic component, the substance being deposited as a thin film upon the substrate in a reactive atmosphere having the reactive agent, having a physical property from a group or properties ranging from the organic to the inorganic, said physical property being determined at least in part by a relative proportion of M and R.

Thus the interconnecting layer may be a material of the general formula M—O—C—H—N wherein M is a metal, wherein M, O, C, H, and N are present in a ratio determined by the ratio of feed compounds in said vacuum deposition process. Typical metals "M" include, but are not limited to, silicon, titanium, tantalum, hafnium, zirconium, boron, yttrium, germanium, cerium, tin, potassium, rubidium, francium, beryllium, magnesium, calcium, strontium, barium, sodium, lithium, zinc, etc. C may be present or absent, M may be absent when C is present, or C may be absent when M is present. Each of O, H or N may be present or absent, as exemplified by the list of specific materials above. For example, O may be absent when N is present, N may be absent when O is present, both N and O may be present, and some H is typically present when only C is also present, as in diamond-like carbon. Thus the interconnecting layer typically has a physical property selected from a group of properties ranging from the organic to the inorganic, as described in U.S. Pat. No. 5,009,920 to Lee (incorporated by reference above).

In one embodiment of the invention described in U.S. Pat. No. 5,009,920 to Lee (incorporated by reference above), where the interconnecting layer is deposited by plasma enhanced chemical vapor deposition (PECVD) a starting reactant (tyically in the form of M—R wherein M denotes a metal atom and R denotes an organic compound or hydrogen), an inert gas such as helium, argon, neon, xenon and krypton, and a reactive gas such as oxygen, nitrogen, ozone, nitrogen oxide. PECVD is then carried out in accordance with known techniques, with the hard interconnecting layer deposited as a thin film. The film has physical properties ranging from the organic to the inorganic, determined at least in part by a relative proportion of M, R, oxygen and hydrogen in the reaction mixture.

In another embodiment, the vacuum deposited hard interconnecting layer comprises the product of a starting reactant in the form of a hydrocarbon, which is reacted and deposited in the presence of an inert gas such as helium, argon, xenon, neon and krypton. Again, the substance is deposited as a thin film, with the properties of the film being determined at least in part by the relative proportion of C and H in the starting reactant.

In a preferred embodiment, the starting reactant M—R for the vacuum deposition step (preferably a PECVD step) is an organosilicon compound such as silane, tetramethyl silane, hexamethyldisilane, hexamethyldidiloxane hexamethyl disilazane or octamethylcyclotetrasiloxane. In another embodiment, the metal M of the starting reactant M—R is titanium, boron, aluminum, tantalum, germanium, zirconium, yttrium, hafnium and magnesium.

Where vacuum deposition of the interconnecting layer is carried out by physical vapor deposition (PVD), the interconnecting layer may comprise a material such as SiO$_2$, Al$_2$O$_3$, TiO$_2$, silicon nitride, aluminum nitride, or InSnO$_2$.

When the interconnecting layer is applied by sputtering, the thin film may again comprise a material such as SiO$_2$, Al$_2$O$_3$, TiO$_2$, silicon nitride, aluminum nitride, or InSnO$_2$.

PECVD may be carried out by any of a variety of means as is known in the art. The interconnecting layer may be applied in a capacitively coupled plasma, in an inductively coupled plasma, or in an ion beam plasma. The vacuum deposited hard interconnecting layer may be deposited in a plasma beam, or by PVD as described above.

The hydrophobic organic lubricant used to form the lubricous layer for the present invention can be a topical lubricant, such as used to reduce wear of rigid articles. However, the term "lubricant" as used herein is intended to encompass materials that accomplish the intended result of forming a hydrophobic wear-resistant surface on the article, whether or not those materials are conventionally employed as lubricants. Fatty acids and fatty acid esters are excellent boundary lubricants. Esters such as tridecyl stearate, butyl stearate, butyl palmitate, stearic acid, and myristic acids are commonly used lubricants and can be used to carry out the present invention. Fluorocarbons (i.e., fluoropolymers) such as perfluoropolyethers (PFPEs) are among the more chemically stable lubricants, and are particularly preferred.

Examples of suitable fluorocarbons include, but are not limited to, fluoropolyethers, fluoroacrylates, fluoroolefins, fluorostyrenes, fluoroalkylene oxides (e.g., perfluoropropylene oxide, perfluorocyclohexene oxide), fluorinated vinyl alkyl ethers and the copolymers thereof with suitable comonomers, wherein the comonomers are fluorinated or unfluorinated. Preferred are perfluorinated fluoropolymers (i.e., perfluoropolymers), with the term "perfluorinated" as used herein meaning that all or essentially all hydrogen atoms on the polymer are replaced with fluorine. Fluoropolyethers are preferred, and perfluoropolyethers are most preferred. Fluoropolyethers or perfluoropolyethers with one or two end terminal hydroxy groups are particularly preferred.

Fluoropolyethers are polymeric compounds composed of multiple, sequentially linked, fluorinated aliphatic ether units (e.g., polymers of the formula $(RO)_nR$ wherein the R groups are the same or different and are linear or branched, saturated or unsaturated C1–C4 alkyl; typically linear or branched saturated C1–C4 alkyl, with the number of repeats "n" giving the desired molecular weight); perfluoropolyethers refers to such polymers in which essentially all of the hydrogens have been substituted with fluorine. Three examples of perfluoropolyethers are perfluoropolymethylisopropyl-ethers such as the polymers of formula I (marketed under the tradname FOMBLIN™ by Montefluos SpA, Via Principe Eugenio 1/5, 20155 Milan Italy) and polymers of Formula II (marketed under the tradename AFLUNOX™), and polymers of Formula III (marketed under the tradename FOBLIN Z_DOL™).

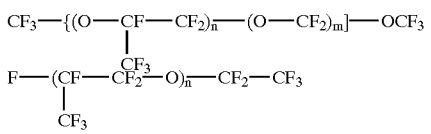

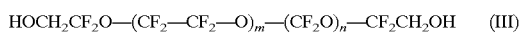

$$HOCH_2CF_2O-(CF_2-CF_2-O)_m-(CF_2O)_n-CF_2CH_2OH \quad (III)$$

It will be appreciated by those skilled in the art that the number of units in a polymer, e.g., "n" and "m" in formulas I–III above, are not normally specified, but rather the molecular weight range for the polymer is specified. Fluoropolymers useful in the present invention will typically have molecular weights ranging from about 500 grams per mole or more (e.g., to about 20,000 grams per mole or more). Thus, for example, n and m in formulas I and II above may be integers ranging from two to three to about a hundred.

The lubricant may be applied to or deposited on the interconnecting layer by any suitable means, such as by contacting the interconnecting layer to an aqueous or non-aqueous fluid (typically a liquid) containing the lubricant (e.g., by dipping). The article carrying the interconnecting layer can then be removed, and excess lubricant removed by air drying, blotting, etc.

Bonding of the hydrophobic coating layer to the interconnecting layer can be carried out by any suitable means which imparts energy to the article, such as by heating or subjecting the article to ultraviolet radiation. The time, duration, intensity, etc. of the bonding treatment or step should be sufficient to achieve the desired level of bonding as determined by the contact angle test described below. In general, bonding can be carried out by heating the substrate for 10 minutes to 10 hours at a temperature of 70 degrees centigrade or more (e.g., up to about 300 or 400 degrees centigrade) (preferably, for about 1 hour at about 115 degrees centigrade).

Figure 3:
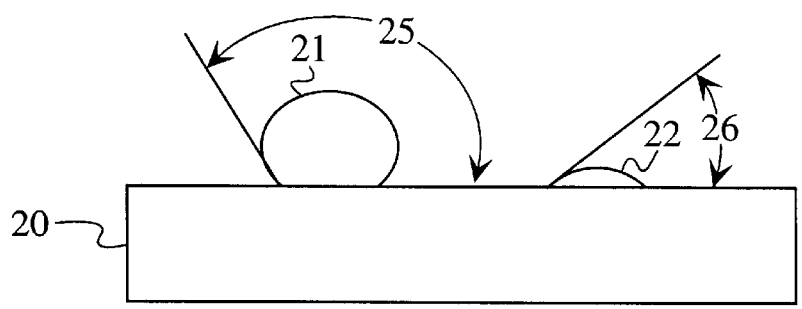
FIG. 3 illustrates contact angle measurement, used to determine bonding of the hydrophobic coating layer to the interconnecting layer in the present invention.

As noted above, the contact angle can be used as a measure of the hydrophobicity of the wear-resistant surface, and to determine the presence or absence of bonding of a hydrophobic coating to a surface (see the discussion of "bonded" below). In general, contact angle is measured by depositing water droplets on a surface to be tested so that the angle between the surface of the droplet and the surface of the substrate is measured. Highly wettable, hydrophilic surfaces exhibit zero contact angle. Hydrophobic surfaces exhibit a contact angle generally greater than 45 degrees. Such contact angle measurements are carried out in accordance with standard techniques, such as described in ASTM C813-90 and ASTM D724-94. In FIG. 3, in which a substrate 20 is shown carrying droplet 21 on the left and droplet 22 right, the droplet 21 represents a droplet on a hydrophobic surface with a contact angle 25 greater than 90 degrees, while the droplet 22 represents a droplet on a less hydrophobic, and more hydrophilic, surface with a contact angle 26 less than 90 degrees, and indeed somewhat less than 45 degrees. Note the greater spreading of the droplet on the right, which represents greater wetting of the surface by the droplet on the right, and that complete spreading of the droplet would result in an essentially flat surface having a contact angle of essentially zero, as found on a hydrophilic surface.

Bonding of the hydrophobic layer to the interconnecting layer is conveniently determined by measurement of the contact angle thereof of the surface portion carrying the hydrophobic surface portion after washing (i.e., dipping) the surface in isopropanol solution. If the hydrophobic layer is not bonded, then washing that layer in isopropanol solution will remove the majority thereof and the contact angle will be substantially decreased. In the present invention, after isopropanol wash, a surface to which the hydrophobic coating layer is bonded will exhibit a contact angle of at least about 45 degrees, and more preferably at least about 90 degrees. For contact angle measurement, the wash may be carried out by immersing, or dipping, the surface to be tested in a 99.9% isopropanol solution in an ultrasonic cleaner (Fisher Scientific Model FS 3) for five minutes at room temperature and then blown dry with nitrogen.

As will be appreciated, wear resistance incorporates a combination of features, including hardness, lubricity, scratch resistance, resistance to temperature change or humidity, etc. The Bayer Index described above provides a useful indicia of wear resistance. After the bonding step (it is less preferred to have a wear-resistant surface that is easily removed by an organic solvent), the wear-resistant surfaces on the articles of the invention preferably have a Bayer Index of at least about 5 or 10, preferably at least about 20 or 30 or more. As will be shown in greater detail in the following non-limiting Examples, the combination of the interconnecting layer with the lubricous layer results in superior wear resistant articles.

The following examples are provided to more fully describe the present invention. It is intended that these examples be considered as illustrative of the invention and not as limiting thereof. In the examples, "W" means Watts, "V" means volts, "mTorr" means milliTorr, "sccm" means standard cubic centimeters per minute, "TMS" means tetramethylsilane, "CR-39™" refers to allyl diglycol carbonate polymer, "mm" means millimeters, and "sec." means second.

EXAMPLE 1

Coating of "C-Coated" Polycarbonate Lenses

This example illustrates that the invention can be used to apply a wear resistant coating on plastic articles that are "C" coated. The following steps were carried out.

1. Commercially supplied "C" coated polycarbonate lenses obtained from Vision Ease, P.O. Box 968, St. Cloud, Minn. 56302, were degreased by immersing them for five minutes in an ultrasonic bath filled with ethanol, then removed and blown dry with nitrogen gas.

2. The lenses were mounted on a substrate holder and inserted into a vacuum coating chamber which was evacuated to a pressure of of approximately $5\times10^{-6}$ Torr. The substrates were sputter etched for 15 minutes in a capacitively coupled argon plasma at 260 Watts forward power and 75 Watts reflected power achieving a bias voltage of -250V at a gas pressure of 40 mtorr.

3. The chamber was again evacuated to a base pressure of approximately $5\times10^{-6}$ torr, wherein a gas mixture containing 2% silane ($SIH_4$) and 98% argon was introduced at a rate of 55 sccm along with 10 sccm of oxygen. The chamber pressure was adjusted to 40 mtorr and a capacitively coupled radio-frequency plasma was initiated at 260 W forward power and 75 W reflected power, achieving a -250V bias. A transparent SiOxHy coating of approximately 150 Angstroms thick was deposited on each lens.

4. The chamber was again evacuated to approximately $5\times10^{-6}$ Torr and a gas mixture consisting of 1.5 sccm tetramethylsilane (TMS), 15 sccm oxygen and 40 sccm argon was introduced into the chamber adjusting the pressure to 40 mtorr. A capacitively coupled radio-frequency plasma was initiated at 240 W forward power and 75 W reflected power achieving a -250V bias. A $SiO_xC_yH_z$ coating of approximately 7500° was deposited. The chamber was brought to atmospheric pressure by backfilling with nitrogen and the lenses removed.

5. The lenses were immediately dipped into a solution containing 10 grams of Fomblin ZDOL Ausimont Catalogue Number 69991-67-9 per liter of PFSI (Ausimont's perfluoronated cleaning solvent) to deposit the lubricous coating (B coat). The lens was removed from the solution at a constant rate of 2 mm/sec., dried and cured in an oven at 115° C. for 1 hour. The resulting B coat was approximately 50 to 75 Angstroms thick.

EXAMPLE 2

Coating of Previously Uncoated Polymeric Articles

This example illustrates the invention on polycarbonate lenses without "C" coat.

Polycarbonate lenses without "C" coat were degreased by immersing them for five minutes in an ultrasonic bath filled with ethanol, removed and blown dry with nitrogen gas.

The lenses were sputter etched in an oxygen plasma at 40 mtorr pressure and 250 Watts forward power and 75 Watts reflected power for one minute.

The chamber was then evacuated to a base pressure of approximately $5\times10^{-6}$ Torr and a gas mixture consisting of 1.5 sccm TMS and 45 sccm argon introduced to achieve a pressure of 40 mtorr. A $Si_xC_yH_z$ coating of approximately 80 Angstroms was deposited at 250 Watt forward power and 75 Watt reflected power achieving -250V bias.

The chamber was again evacuated to approximately $5\times10^{-6}$ Torr and a gas mixture consisting of 1.5 sccm tetramethylsilane (TMS), 15 sccm oxygen and 40 sccm argon was introduced into the chamber adjusting the pressure to 40 mtorr. A capacitively coupled radio-frequency plasma was initiated at 240 W forward power and 75 W reflected power achieving a -250V bias. A $SiO_xC_yH_z$ coating of approximately 10,000 Angstroms was deposited. The chamber was brought to atmospheric pressure by backfilling with nitrogen and the lenses removed.

The lenses were immediately dipped into a solution containing 10 grams of Fomblin ZDOL per liter of PFSI to deposit the lubricous coating (B coat). The lens was removed from the solution at a constant rate of 2 mm/sec., dried and cured in an oven at 115° C. for one hour. The resulting B coat was approximately 50 to 75 Angstroms thick.

EXAMPLE 3

Titanium Coating of "C-Coated" Polycarbonate Lenses

This example illustrates that the invention can be used to apply a wear resistant coating of plastic articles that are "C" coated. The following steps were carried out. Commercially supplied "C" coated polycarbonate lenses obtained from Vision Ease, P.O. Box 968, St. Cloud, Minn. 56302, were degreased by immersing them for five minutes in an ultrasonic bath filled with ethanol, then removed and blown dry with nitrogen gas. The lenses were mounted on a substrate holder and inserted into a vacuum coating chamber which was evacuated to a pressure of approximately $5\times10^{-6}$ Torr. The substrates were sputter etched for 15 minutes in a capacitively coupled argon plasma at 260 Watts forward power and 75 Watts reflected power achieving a bias voltage of -250 V at a gas pressure of 40 m Torr. The chamber was again evacuated to a base pressure of approximately $5\times10^{-6}$ Torr, wherein a gas mixture containing 1.4 sccm of Titanium isopropoxide (TIPT), 15 sccm of oxygen and 40 sccm of argon. The chamber pressure was adjusted to 40 mtorr and a capacitively coupled radio-frequency plasma was initiated at 200 Watts forward power and 75 Watts reflected power, achieving a -250 V bias. A transparent $TiO_xC_yH_z$ coating with thickness approximately 150 Angstroms was deposited on each lens. The chamber was again evacuated to approximately $5\times10^{-6}$ Torr and a gas mixture consisting of 1.5 sccm tetramethylsilane (TMS), 15 sccm oxygen and 40 mtorr argon was introduced into the chamber adjusting the pressure to 40 mtorr. A capacitively coupled radio-frequency plasma was initiated at 240 W forward power and 75 W reflected power achieving a -250 V bias. A $SiO_xC_yH_z$ coating of approximately 7500 Angstroms was deposited. The chamber was brought to atmospheric pressure by backfilling with nitrogen and the lenses were removed. The lenses were immediately dipped into a solution containing 10 grams of Fomblin Z-DOL per liter of PFS-1 solvent to deposit the lubricious coating (B coat). The lens was removed from the solution at a constant rate of 2 mm/sec, dried and cured in an oven at 110° C. for 1 hour. The resulting B coat was approximately 50 to 75 Angstroms thick.

EXAMPLE 4

Performance Testing

Lenses prepared as described above, and various other lenses, were subjected to contact angle testing in accordance with ASTM D724 and ASTM C813 before and after isopropanol wash, in the manner described above, and the Bayer Index was determined with Norton Advanced Ceramics alumina-zirconia abrasive grain coat 1424, grit size 12 as the abrasive in accordance with ASTM 735-94, as described above. Results are given in Table 1 below. Note that the interconnecting layer, or "A-coat" alone (article 3 in table 1) gives a Bayer Index of only 3–5. The hydrophobic layer, or "B-coat" alone gives a Bayer Index of 3, but washes off with isopropanol if the layer is not bonded. In contrast, a product prepared according to Example 1 above (article 7 in table 1) provided a Bayer Index greater than about 30.

The foregoing examples are illustrative of the present invention, and are not to be construed as limiting thereof. The invention is defined by the following claims, with equivalents of the claims to be included therein.

TABLE 1

Contact Angle and Abrasion Resistance data.

| Substrate/Coating | Coating Thickness (microns) | Contact Angle Before Wash | Contact Angle After Wash[1] | Abrasion Resistance After Wash (Bayer Test) |
|---|---|---|---|---|
| 1. Polycarbonate (PC) | 0 | 70 | 70 | very poor |
| 2. CR-39 Substrate | 0 | 65 | 65 | fair |
| 3. Vison Ease ™ C coated PC[2] | 3 | 80 | 80 | 3 |
| 4. C coated PC + A coat[3] | 3 + 1 | 30 | 30 | 3–5 |
| 5. C coated PC + B coat[4] | 3 + 1 + 50A[5] | 110 | 50 | 3 |
| 6. C coated PC + O₂ plasma etch + B coat | 3 + 1 + 50A 50A | 110 | 100 | 3 |
| 7. C Coated PC + A coat + B coat (Example 1) | 3 + 1 + 50A | 110 | 110 | 30 + |

[1]Isopropanol wash.
[2]A commercially available product. C-coated poly(2,2'dihydroxyphenylpropane)carbonate.
[3]A coat refers to the TMS + $O_2$ interconnecting layer.
[4]B coat refers to the lubricious layer
[5]The B coat, where present, is approximately 50 Angstroms (25–150 Angstroms) thick. All other measures are in microns

What is claimed is:

1. A substantially optically transparent article having a wear-resistant surface, comprising:
    a substantially optically transparent polymeric substrate having a hardened surface portion;
    a hard antiabrasive interconnecting layer formed on said surface portion by the process of vacuum deposition of feed compounds and comprising (i) an $SiO_xH_y$ layer formed on said surface portion and (ii) an $SiO_xC_yH_z$ layer formed on said $SiO_xH_y$ layer; and
    a lubricious fluoropolyether coating layer bonded to said interconnecting layer by the process of heating or subjecting said article to ultraviolet radiation;
    with said hard antiabrasive interconnecting layer and said lubricious fluoropolyether coating layer together forming said wear-resistant surface;
    said wear-resistant surface having a Bayer Index of at least about 20; and
    said wear-resistant surface having a contact angle after isopropanol wash at room temperature for ten minutes of at least about 45 degrees.

2. An article according to claim 1, wherein said lubricious fluoropolyether coating layer is from about 1 to about 500 Angstroms thick.

3. An article according to claim 1, wherein said substrate comprises polyacrylate.

4. An article according to claim 1, wherein said substrate comprises polystyrene.

5. An article according to claim 1, wherein said substrate comprises polycarbonate.

6. An article according to claim 1, wherein said substrate comprises poly (2,2'-dihydroxyphenylpropane)carbonate.

7. An article according to claim 1, wherein said substrate comprises polydiethyleneglycol bis(allyl carbonate).

8. An article according to claim 1, wherein said substrate comprises a plurality of layers.

9. An article according to claim 1, wherein said vacuum deposition process is selected from the group consisting of plasma vapor deposition, plasma-enhanced chemical vapor deposition, physical vapor deposition, and sputtering.

10. An article according to claim 1, wherein:
    (a) said substrate comprises a material selected from the group consisting of polycarbonate, poly (2,2'-dihydroxyphenylpropane)carbonate, polydiethyleneglycol bis(allyl carbonate), polyacrylate, and polystyrene;
    (b) said lubricious fluoropolyether coating layer is from about 1 to about 500 Angstroms thick;
    (c) said lubricous fluoropolyether coating layer comprises a perfluoropolyether.

11. An article according to claim 1, wherein said article is a lens.

12. An article according to claim 1, wherein said article is a visor or display screen.

13. An article according to claim 1, wherein said article is a window.

* * * * *